United States Patent
Iwane et al.

(10) Patent No.: US 6,534,383 B1
(45) Date of Patent: Mar. 18, 2003

(54) THIN FILM FORMATION PROCESS BY CLEARING THE IMPLANTED LAYER WITH LASER RADIATION

(75) Inventors: Masaaki Iwane, Atsugi (JP); Takao Yonehara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/635,246

(22) Filed: Aug. 9, 2000

Related U.S. Application Data

(62) Division of application No. 09/047,336, filed on Mar. 25, 1998, now Pat. No. 6,133,112.

(30) Foreign Application Priority Data

Mar. 26, 1997 (JP) .............................. 9-073691

(51) Int. Cl.[7] .......................... H01L 21/30; H01L 21/46
(52) U.S. Cl. ..................................... 438/458; 438/455
(58) Field of Search ................... 438/455, 458

(56) References Cited

U.S. PATENT DOCUMENTS

| 4,237,150 A | 12/1980 | Weismann .................. 438/479 |
| 4,392,011 A | 7/1983 | Pancove et al. ............ 136/261 |
| 5,171,717 A | * 12/1992 | Broom et al. ................. 438/33 |

(List continued on next page.)

FOREIGN PATENT DOCUMENTS

| DE | 143982 | * 9/1980 |
| EP | 0665588 A | 8/1995 |
| EP | 0753886 A | 1/1997 |
| EP | 0843344 A | 5/1998 |
| EP | 0843346 A | 5/1998 |
| JP | 7-254690 | 10/1995 |
| JP | 7302889 A | 11/1995 |
| JP | 8213645 A | 8/1996 |

OTHER PUBLICATIONS

IBM technical Disclosure Bulletin, vol. 24, Issue No. 7A, p 3380, Dec. 1981.*
Endert et al., "Excimer laser: A New Tool for precision Micromachining", Optical and Quantum Electronics, vol. 27, p. 1319 (1995).*
Takao Yonehara, et al., "Epitaxial Layer Transfer by Bond and Etch Back of Porous Si", Applied Physics Letters, 1994, vol. 64, pp. 2108–10.

*Primary Examiner*—Kamand Cuneo
*Assistant Examiner*—Asok Kumar Sarkar
(74) *Attorney, Agent, or Firm*—Fitzpatrick, Cella, Harper & Scinto

(57) ABSTRACT

A process for thin film formation is provided which comprises a step of separation of a substrate constituted of a nonporous Si layer, a porous Si layer formed thereon, and a less porous Si layer formed further thereon into the nonporous Si layer and the less porous Si layer at the porous Si layer, wherein the separation is caused by projecting a laser beam through the side face of the substrate. From the separated substrate, an SOI substrate is prepared, and the non porous Si layer is recycled to the SOI substrate production process. This SOI substrate production process saves the consumption of the material and lowers the production cost. The substrates are separated definitely. A process for producing a photoelectric transducing apparatus such as solar cells with material saving and low cost is also provided in which the porous layer is separated definitely without strong adhesion between the substrate and a jig.

13 Claims, 16 Drawing Sheets

U.S. PATENT DOCUMENTS

| | | | |
|---|---|---|---|
| 5,371,037 A | 12/1994 | Yonehara | 437/86 |
| 5,371,564 A | 12/1994 | Hasuda | 354/246 |
| 5,374,564 A * | 12/1994 | Bruel | 438/455 |
| 5,559,043 A | 9/1996 | Bruel | 437/24 |
| 5,695,557 A | 12/1997 | Yamagata et al. | 117/97 |
| 5,714,415 A | 2/1998 | Oguro | 438/486 |
| 5,854,123 A | 12/1998 | Sato et al. | 438/507 |
| 5,856,229 A | 1/1999 | Sakaguchi et al. | 438/406 |
| 5,863,830 A | 1/1999 | Bruel et al. | 437/478 |
| 5,893,747 A | 4/1999 | Yang | 438/482 |
| 5,922,224 A * | 7/1999 | Brockroelofs | 219/121.72 |
| 5,966,620 A | 10/1999 | Sakaguchi et al. | 438/455 |
| 5,968,382 A * | 10/1999 | Matsumoto et al. | 219/121.72 |
| 5,985,742 A | 11/1999 | Henley et al. | 438/515 |
| 5,994,207 A | 11/1999 | Henley et al. | 438/515 |
| 6,010,579 A | 1/2000 | Henley et al. | 148/33.2 |
| 6,013,563 A | 1/2000 | Henley et al. | 438/458 |
| 6,013,567 A | 1/2000 | Henley et al. | 438/515 |
| 6,020,252 A * | 2/2000 | Asper et al. | 438/458 |
| 6,033,974 A | 3/2000 | Henley et al. | 438/526 |
| 6,048,411 A | 4/2000 | Henley et al. | 148/33.5 |
| 6,054,363 A | 4/2000 | Sakaguchi et al. | 438/406 |
| 6,100,165 A | 8/2000 | Sakaguchi et al. | 438/455 |
| 6,100,166 A | 8/2000 | Sakaguchi et al. | 438/455 |

* cited by examiner

THIN FILM FORMATION PROCESS BY CLEARING THE IMPLANTED LAYER WITH LASER RADIATION

RELATED APPLICATIONS

This application is a divisional of U.S. Ser. No. 09/047,336 filed Mar. 25, 1998 now U.S. Pat. No. 6,133,112.

BACKGROUND OF THE INVENTION

1. Field of the Invention

The present invention relates to a process for forming a thin film for an SOI substrate, or a photoelectric transducers such as solar cells and area sensors.

2. Related Background Art

The integrated circuit formed on a SOI substrate (semiconductor on insulator) has various advantages over integrated circuits formed on a usual silicon wafer, such as (1) ease of separation of a dielectric material and potentiality of high integration, (2) high resistance against radiation rays, (3) low floating capacity and high speed processing, (4) no welling process required, (5) capability of latch-up prevention, and (6) high speed and low energy consumption owing to formation of a thin complete depletion type field effect transistor.

For formation of a substrate of the SOI structure, methods are disclosed in U.S. Pat. No. 5,371,037, and T. Yonehara et al., Appl. Phys. Lett., vol. 64, 2108 (1994). FIGS. 16A to 16E, and FIGS. 17A to 17D show the processes. In the drawings, the numerals 1 and 5 indicate a Si wafer, 2 a nonporous Si layer, 3 a porous Si layer, 4 an epitaxial Si layer, 6 a single crystalline Si layer, and 7 a Si oxide layer. Si wafer 1 as a device substrate shown in FIG. 16A is anodized to prepare a substrate constituted of nonporous Si layer 2 and porous Si layer 3 formed thereon as shown in FIG. 16B. Epitaxial layer 4 is formed on the surface of porous Si layer 3 as shown in FIG. 16C. Separately, Si wafer 5 as a supporting substrate shown in FIG. 16D is provided, and the surface is oxidized to form a substrate constituted of monocrystalline Si layer 6 and Si oxide layer 7 on the surface as shown in FIG. 16E. The substrate (2, 3, 4) of FIG. 16C is turned over, and is placed on the substrate (6, 7) of FIG. 16E with epitaxial layer 4 and Si oxide layer 7 counterposed as shown in FIG. 17A. The two substrates are bonded by adhesion of epitaxial layer 4 to Si oxide layer 7 as shown in FIG. 17B. Then nonporous Si layer 2 is removed mechanically by grinding from the non-bonded layer side to uncover porous Si layer 3 as shown in FIG. 17C. Porous Si layer 3 is removed by wet etching with an etching solution for selective etching of porous Si layer 3 as shown in FIG. 17D to obtain a SOI substrate having epitaxial layer 4 of extremely uniform thickness for a semiconductor of an SOI substrate.

In the above process for producing the SOI substrate, nonporous Si layer 2 is removed from the substrate of FIG. 17B by grinding to obtain the substrate of FIG. 17C. Therefore, one substrate 1 to be worked into two-layers of nonporous layer 2 and porous layer 3 is required for production of one SOI substrate. Japanese Patent Application Laid-Open No. 7-302889 discloses a method of repeated use of nonporous Si layer 2 in the SOI substrate production process. In the disclosed process, parts 4,7,6 for the SOI substrate are separated from part 2 at porous layer 3 by applying a pulling, squeezing, or shearing force, or inserting a jig into porous layer 3, and separated nonporous Si layer 2 is used repeatedly as Si wafer 1 of FIG. 16A.

Nowadays, most solar cells employ amorphous Si for the structure suitable for large areas. However, monocrystalline Si and polycrystalline Si are also noticed for the solar cells in view of the transducing efficiency and the life thereof. Japanese Patent Application Laid-Open No. 8-213645 discloses a process of providing a thin film solar cell at a low cost. In this process, porous Si layer 3 is formed on Si wafer 1; thereon, $p^+$-type Si layer 21, p-type Si layer 22, and $n^+$-type Si layer 23 are grown epitaxially for solar cell layers; protection layer 30 is formed on $n^+$-layer 23; jig 31 is bonded to the reverse face of Si wafer 1 and jig 32 is bonded onto the surface of protection layer 30 by adhesive 34; jigs 31,32 are pulled respectively in opposite directions to break porous Si layer 3 mechanically to separate solar layers 21,22,23. The solar cell layers 21,22,23 are interposed between two plastic substrates to provide a flexible thin film solar cell. This disclosure mentions repeated use of Si wafer 1, and partial notching 33 of the edge side face of porous Si layer 3 by a mechanical method or laser beam irradiation.

In production of SOI substrates, the process disclosed in the aforementioned Japanese Patent Application Laid-Open No. 7-302889 enables reduction of the production cost by repeated use of the Si wafer. However, this method is not satisfactory in reproducibility.

In production of solar cells, the process disclosed in the above Japanese Patent Application Laid-Open No. 8-213645 does not always allow definite separation at the porous Si layer, causing occasional cracking in the epitaxial layer to result in lower production yield. Further, this process conducts the separation by mechanical pulling, which requires strong adhesion between the jig and the monocrystalline Si layer and is not suitable for mass production.

SUMMARY OF THE INVENTION

An object of the present invention is to provide a process for forming a thin film at a low cost, with definite separation of a wafer, with efficient utilization of the wafer, with effective use of the resource with high productivity in production of photoelectric transducer devices such as solar cells.

After comprehensive studies for solving the above problems, the process below has been found by the inventors of the present invention. The process of the present invention for forming a thin film comprises a step of separation of a substrate constituted of a nonporous layer, a porous layer formed thereon, and a less porous layer which has a less porosity than that of the porous layer formed further on the porous layer into the nonporous layer and the less porous layer at the porous layer, the step of separation being caused by projecting a laser beam through the side face of the substrate into the center of the substrate.

The laser beam is preferably focused onto the side edge face of the porous layer to swell the porous layer. The porous layer is formed on the nonporous layer desirably by anodization of a Si wafer. The nonporous layer may be pulled by applying a slight force to the substrate by a vacuum chuck brought into close contact with the face reverse to the porous layer side.

The laser beam is preferably an excimer laser beam in the present invention. The laser beam may be projected to plural sites of the porous layer. The laser beam may be focused by a cylindrical lens linearly and is projected along the porous layer.

The aforementioned less porous layer is preferably formed on the porous layer by epitaxial growth. After the epitaxial layer is bonded to a supporting substrate having an insulation layer at least on the surface, the separation is caused at the porous layer. The porous layer remaining on the epitaxial layer is removed to utilize the epitaxial layer and the insulation layer respectively as a semiconductor layer and an underlaying insulation layer of a SOI substrate. The supporting substrate having an insulating layer at least on the surface is preferably prepared by oxidation of the surface of a Si wafer. Otherwise, an insulating layer is formed on the epitaxial layer surface; it is bonded to a supporting substrate; separation is caused at the porous layer; the remaining porous layer is removed from the epitaxial layer; and the epitaxial layer and the insulating layer are employed respectively as the semiconductor layer and the underlying insulation layer of the SOI substrate. The supporting substrate may be either a Si wafer having an oxidized surface or a quartz substrate.

The less porous layer may be formed, after the formation of the porous layer by anodization of the wafer, by subsequent anodization with less current density. After the bonding of the less porous layer to the supporting substrate, the separation is caused, and the less porous layer may be employed as a photoelectric transducing layer of a photoelectric transducer. The photoelectric transducing layer may be made of an epitaxial layer. The substrate and the layers are preferably formed from silicon.

DESCRIPTION OF THE PREFERRED EMBODIMENTS

The present invention is described by reference to Embodiments 1 to 8. Embodiments 1 to 4 describe production of a SOI substrate. Embodiments 5 to 7 describe production of photoelectric transducing devices such as solar cells and area sensors. Embodiment 8 describes a method in which the layer for the separation is formed by ion implantation. The present invention covers not only the described Embodiments but also combination of the Embodiments.

In Embodiment 1 of producing a SOI substrate, a laser beam is employed to separate the wafer to be recycled and the SOI substrate at the porous layer. The laser beam is projected to the side face (edge face) in parallel with the plate-shaped substrates at a laser intensity adjusted to reach the substrate center. The laser beam is projected to a relatively fragile layer such as a larger porosity layer or a defective layer having micro-bubbles and is absorbed thereby. The porous fragile layer having absorbed the laser beam becomes more fragile, whereby the less porous layer on the porous fragile layer and nonporous layer are separated at the fragile layer. The method of laser beam projection is described in detail in the following Embodiments.

Embodiment 1

Figure 1:
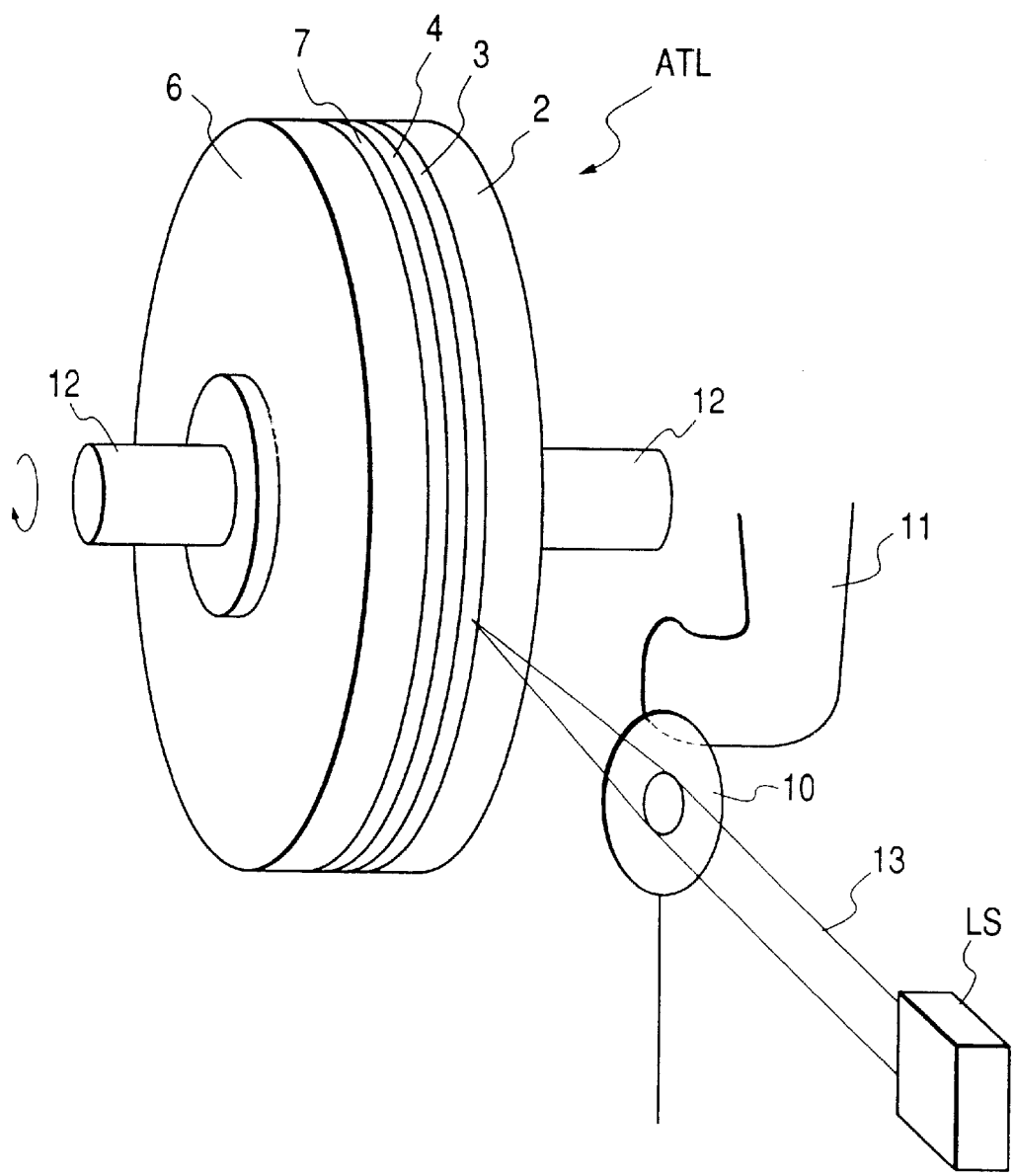
FIG. 1 illustrates a separation step in Embodiment 1 in which a laser beam is projected to a porous Si layer.

FIG. 1 illustrates the separation process of this embodiment. In FIG. 1, the same reference numerals are used as in FIGS. 16A to 16E and FIGS. 17A to 17D. The numeral 10 indicates a lens, 11 an optical microscope, 12 a vacuum chuck, and 13 a laser beam. LS indicates a laser source, and ATL indicates an article constituted of layers 2, 3, 4, 6, and 7 before the separation. A laser beam is projected to the side wall of porous layer 3 from laser source LS. Laser source LS is an excimer laser of high output employing XeCl, KrF, ArF, or the like. The output capacity is preferably in the range from 300 mJ/cm$^2$ to 1 J/cm$^2$, more preferably about 500 mJ/cm$^2$. The excimer laser emits UV light, so that lens 10 is made of quartz or fluorite capable of transmitting the UV light. With this optical system, the laser beam is converged to have a projection area width to 0.1 $\mu$m. Optical microscope 11 is employed, as necessary, to confirm the precise projection of laser beam 13 to porous layer 3 of 0.1 to 30 $\mu$m thick. Since porous layer 3 is fragile and can readily be broken for separation in comparison with nonporous layer 2 and epitaxial layer 4 as a less porous layer, laser beam 13 need not be strictly projected only to porous layer 3. The laser source LS for emitting laser beam 13 is preferably an excimer laser apparatus of high power, but may be an Ar laser, or a YAG laser. For promoting the layer separation, a liquid such as water, methyl alcohol, ethyl alcohol, and isopropyl alcohol may be incorporated into porous layer 3 by injection or adsorption. The liquid, which has a larger thermal expansion coefficient than a solid like Si, promotes the layer separation by expansion.

Vacuum chuck 12 as the substrate holder has a cavity for holding a gas, and holds substrate ATL, before the separation, by contact with the outside face of nonporous layer 2 or monocrystalline layer 6 by evacuation of the gas. In this Embodiment, a pair of vacuum chucks 12 can rotate around the axis at the center of the substrate to project laser beam 13 to the entire side wall of the porous layer 3. Vacuum chucks 12 may be employed only for fixing and rotating the substrate, but may also be employed for applying slight pulling force to the substrate to promote the layer separation.

The laser beam penetrates the side wall of porous layer 3 to the proximity to the center of substrate ATL. Porous layer 3 becomes more fragile by absorption of the laser beam to cause separation of substrate ATL without breaking the nonporous portion.

Figure 2:
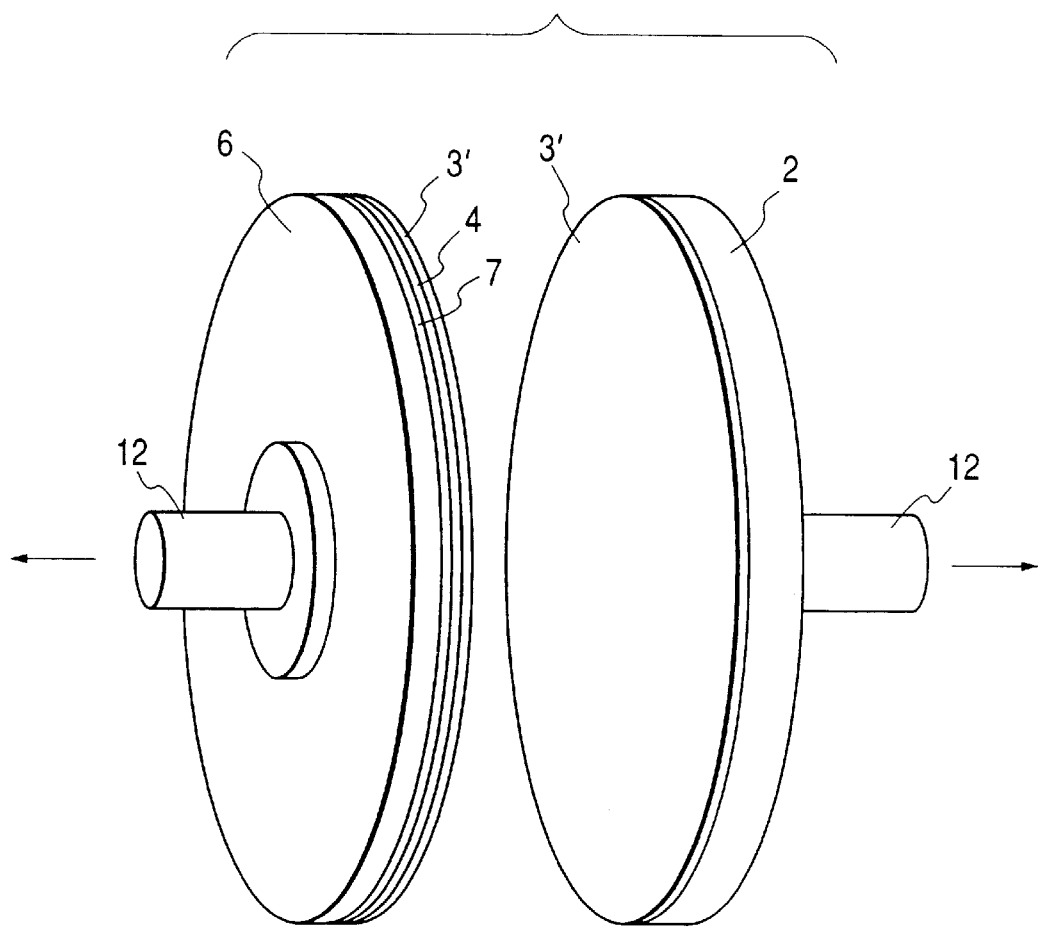
FIG. 2 illustrates substrates after the separation.

By the separation, substrate 4,7,6 for the SOI substrate and substrate 2 to be recycled are separated from each other at porous layer 3. In FIG. 2, portions 3' of porous layers remain on the surfaces (separation plane) of the respective substrates. By reducing sufficiently the thickness of porous layer 3 formed by the anodization, the remaining portions can be practically removed from one or both of the substrates.

A process for thin film formation by the wafer separation as shown in FIG. 1 is described below.

Figure 3:
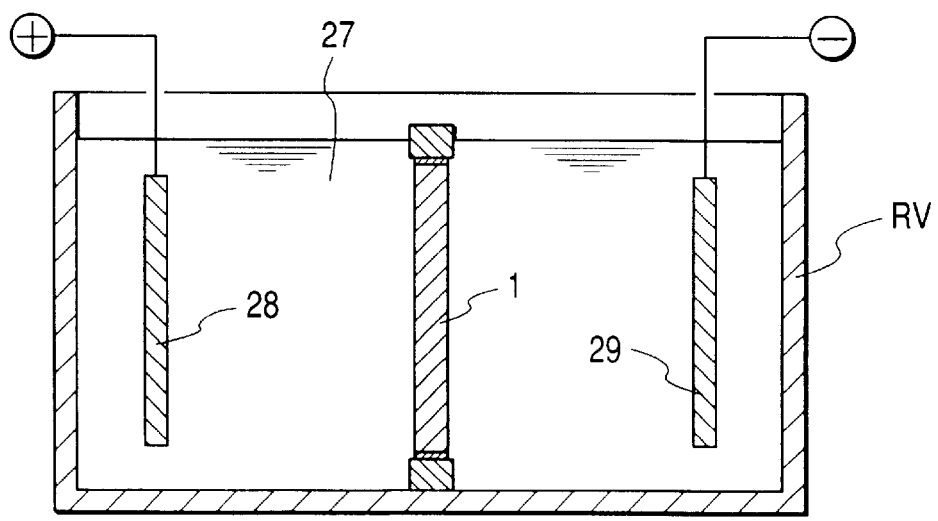
FIG. 3 illustrates a step for producing a SOI substrate by employing a Si wafer as the base material in Embodiment 1.

First, the substrate for the bonding is prepared. FIG. 3 is a sectional view of an apparatus for anodizing a Si wafer. The numeral 1 indicates a Si wafer, 27 an etching solution of hydrofluoric acid type contained in vessel RV, 28 a positive metal electrode, and 29 a negative metal electrode. Si wafer 1 to be anodized is preferably of a p-type, but may be of an n-type of low resistance. An n-type wafer having holes formed by projection of a light beam can also be readily made porous. In FIG. 3, a voltage is applied between positive electrode 28 at the left side and negative electrode 29 at the right side, and Si wafer 1 is placed parallel to the both electrodes to apply an electric field perpendicular to the face of Si wafer in the etching solution. Thereby wafer 1 is made porous from the side of negative electrode 29. Concentrated hydrofluoric acid (49% HF) is employed as an etching solution 27 of the hydrofluoric acid type. Since gas bubbles are generated from Si wafer 1, an alcohol is preferably added to the etching solution 27 as a surfactant to remove the bubbles. The alcohol may include methanol, ethanol, propanol, and isopropanol. Instead of surfactant addition, the solution may be stirred by a stirrer during the anodization.

The thickness of the porous layer is preferably in the range from 0.1 to 30 $\mu$m.

Negative electrode 29 is preferably made of a material resistant against the hydrofluoric acid, such as gold (Au) and platinum (Pt). Positive electrode 28 is also made preferably of a material resistant against the hydrofluoric acid, but may be made of any generally used metal material. The anodization is conducted at a maximum current density of several hundred mA/cm$^2$ or less, but should be more than 0 mA/cm$^2$. The current density is selected so that a high-quality epitaxial layer can be formed on the resulting porous Si layer and the separation can readily be caused at the porous layer. Specifically, at a larger current density in the anodization, the density of Si in the porous Si layer becomes lower, and the volume of the pores is larger, and the porosity (ratio of the pore volume to the total volume of the porous layer) thereof is larger. In spite of many pores formed in the interior of the Si layer, the resulting porous Si retains its monocrystallinity. Owing to the monocrystallinity of the porous Si layer, another monocrystalline Si layer can be grown epitaxially thereon.

For formation of an epitaxial Si layer having no lamination defects, the porosity of the porous Si layer is preferably smaller at the portion to be brought into contact with the epitaxial Si layer. On the other hand, for easy separation of the device substrate and the SOI substrate at the porous Si layer, the porosity of the porous Si layer is preferably larger.

Figure 4:
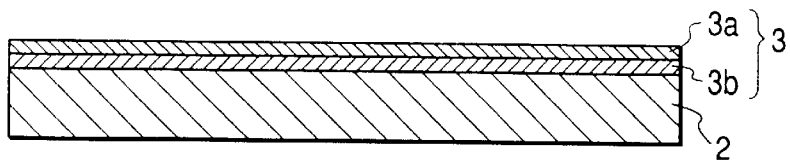
FIG. 4 illustrates a SOI substrate produced by a step for producing a SOI substrate by employing a Si wafer as the base material in Embodiment 1.

Therefore, ideally, the porosity of the porous Si layer is smaller at the outermost surface, and is larger at the side near to the nonporous Si layer. FIG. 4 is a sectional view illustrating the ideal state of the porous Si layer. Porous Si layer 3a, the surface side portion of porous Si layer 3, is formed with a smaller porosity, and porous Si layer 3b, the nonporous Si layer side portion of porous Si layer 3, is formed with a larger porosity. For obtaining this structure, the initial stage of the anodization is conducted at a lower current density to prepare portion 3a, and the later stage of the anodization is conducted at a higher current density to prepare portion 3b. With this structure, the separation of the substrate occurs only at layer 3b, and an epitaxial Si layer can be formed without lamination defects on porous Si layer 3a. The epitaxial Si layer is formed preferably by a growth process such as molecular beam epitaxial growth, plasma CVD, low pressure CVD, photo-assisted CVD, bias sputtering, and liquid phase growth. Particularly, low temperature growth is preferred.

Figure 5A:
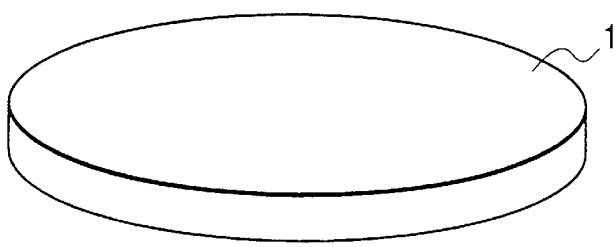
FIGS. 5A, 5B, 5C, and 5D illustrate steps for producing a SOI substrate by employing a quartz plate as the base material in Embodiment 1.
Figure 5B:
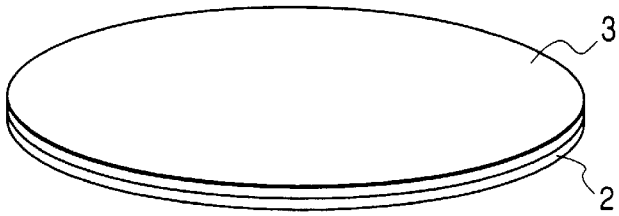

As described above, Si wafer 1 shown in FIG. 5A is made porous at the surface as shown in FIG. 5B. Thereby Si wafer 1 comes to have the structure constituted of nonporous Si layer 2 and porous Si layer 3 laminated thereon.

Figure 5C:
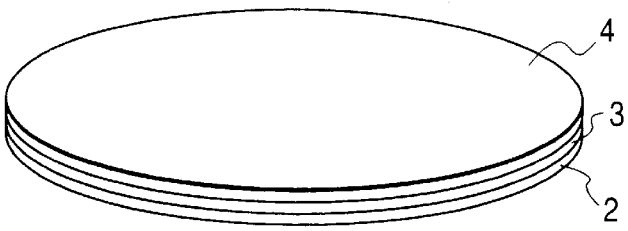
Figure 5D:
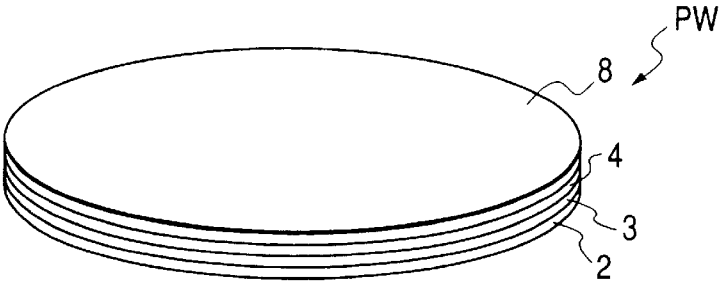

Subsequently, nonporous epitaxial Si layer 4 is formed on porous Si layer 3 as shown in FIG. 5C. If necessary, the surface of epitaxial Si layer 4 is thermally oxidized to form Si oxide layer 8 with a thickness between 0.05 $\mu$m to 2 $\mu$m as shown in FIG. 5D.

As described above, substrate PW called a prime wafer, a bond wafer, or a device substrate is treated before the bonding.

On the other hand, substrate HW called a handle wafer, a base wafer, or a supporting substrate is treated as described below.

A Si wafer is provided, and if necessary, the surface thereof is thermally oxidized to form a Si oxide film of thickness ranging from 0.05 to 3 $\mu$m.

The process of bonding and separation of the substrates is explained below by reference to FIGS. 6A to 6D.

Figure 6A:
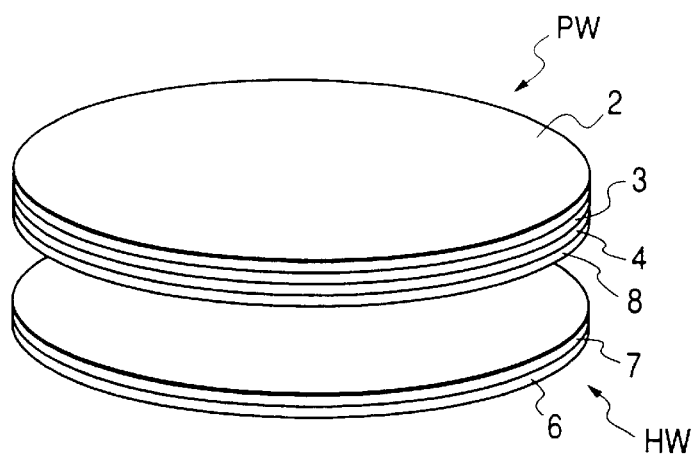
FIGS. 6A, 6B, 6C, and 6D illustrate steps for producing a SOI substrate by employing a Si wafer as the base material in Embodiment 1.

The surface of Si oxide layer 8 on epitaxial Si layer 4 of substrate PW is confronted with the surface of Si oxide layer 7 of substrate HW, and both faces are bonded at room temperature as shown in FIG. 6A. Then the bonding between Si oxide layer 8 and Si oxide layer 7 is strengthened by anode bonding, pressing, or heat treating, or combination thereof to form an article ATL comprising the bonded substrates as shown in FIG. 6B.

Figure 6B:
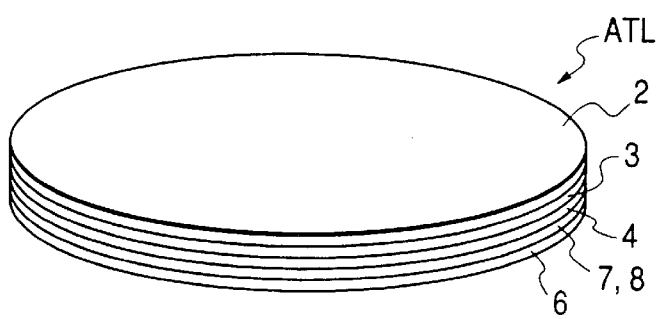
Figure 6C:
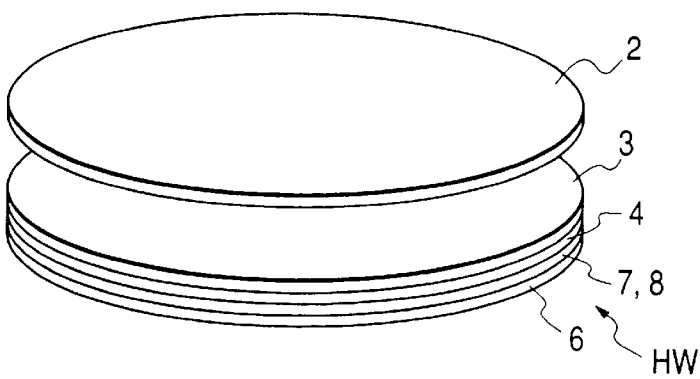

Bonded article ATL having the structure shown in FIG. 6B is placed between a pair of vacuum chucks 12 of the device shown in FIG. 1. With rotation of article ATL, an excimer laser beam is projected to and focused on the portion of porous Si layer 3 of the side face of article ATL. The projected excimer laser beam is absorbed by the entire porous Si layer. In such a manner, nonporous Si layer 2 of substrate PW side is separated from substrate HW as shown in FIG. 6C. By the separation, epitaxial Si layer 4 is transferred onto the surface of substrate HW. Porous Si layer 3 having been broken by absorption of the laser beam may remain on one or both of nonporous Si layer 2 and epitaxial Si layer 4. FIG. 6C shows porous Si layer 3 remaining only on epitaxial Si layer 4.

Figure 6D:
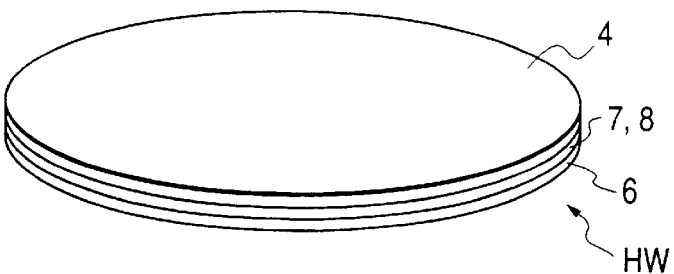

Porous Si layer 3, when it remains on the side of substrate HW, is removed selectively by selective etching. In the selective etching, the porous Si layer is etched more than the nonporous Si layer by nonelectrolytic wet chemical etching by use of an etching solution such as hydrofluoric acid, a mixture of hydrofluoric acid with an alcohol, and a mixture of hydrofluoric acid with aqueous hydrogen peroxide. In particular, by use of a mixture of hydrofluoric acid with hydrogen peroxide, the selective etching ratio of the porous Si layer to the nonporous Si layer is as high as about $10^5$. Thus, epitaxial Si layer 4 remains in a uniform thickness on the surface of substrate HW. Thereby a SOI substrate having extremely uniform semiconductor layer 4 on the insulation layer as shown in FIG. 6D.

Separated nonporous layer 2 is again used as the prime wafer for production of another SOI substrate.

Figure 7A:
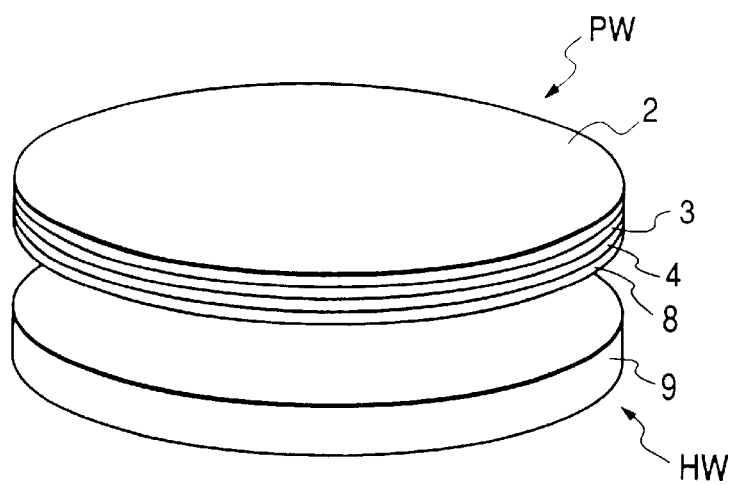
FIGS. 7A, 7B, 7C, and 7D illustrate steps for producing a SOI substrate.
Figure 7B:
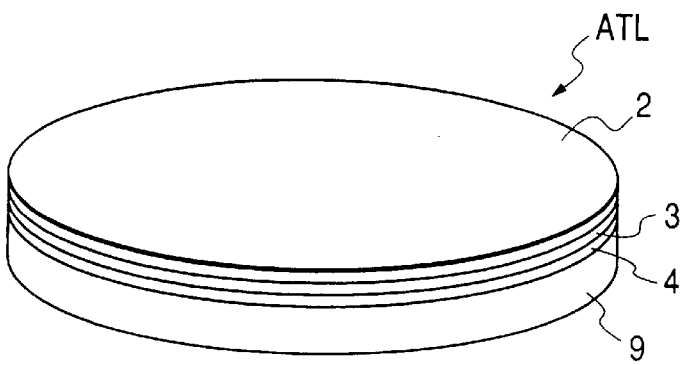
Figure 7C:
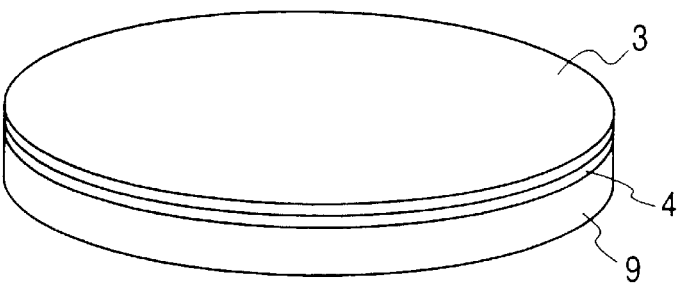
Figure 7D:
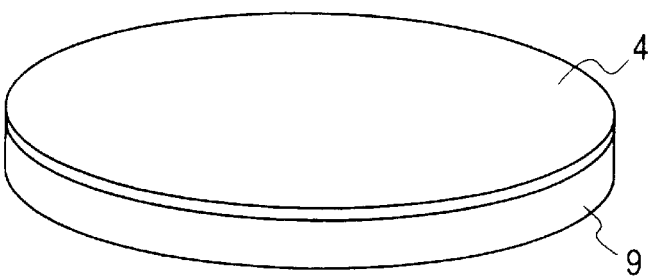

In the process for producing the SOI substrate in this Embodiment, the supporting substrate may be a complete insulating substrate such as a glass substrate and a quartz substrate. FIGS. 7A to 7D illustrate the steps of producing a SOI substrate by use of quartz substrate as the supporting substrate. The device substrate PW at the upper side in FIG. 7A is prepared in the same manner as described by reference to FIGS. 5A to 5D. Quartz substrate 9 as supporting substrate HW is confronted with a Si oxide layer 8 and are bonded tightly by anode bonding, pressing, or thermal treatment, or combination thereof as shown in FIG. 7B. Then, the two substrates are separated by projection of a laser beam in the same manner as described before. Epitaxial Si layer 4 and porous Si layer 3 are transferred onto quartz substrate 9 as shown in FIG. 7C. The remaining porous Si layer 3 is selectively removed in the aforementioned manner. Thus a SOI substrate is obtained which is constituted of quartz base plate 9 and nonporous monocrystalline thin Si film 4 formed thereon as shown in FIG. 7D.

Figure 8A:
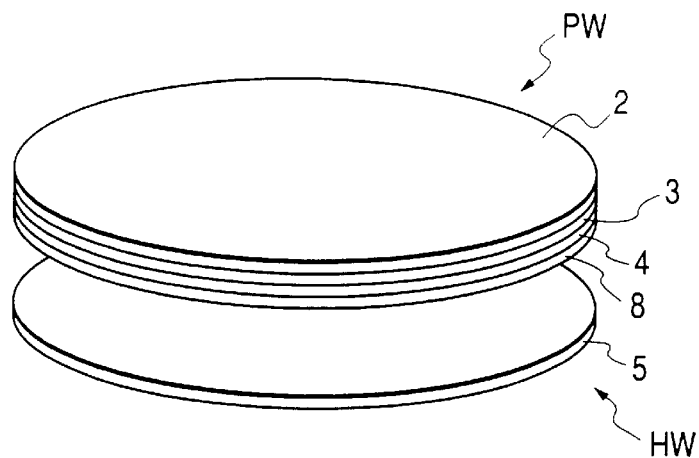
FIGS. 8A, 8B, 8C, and 8D illustrate steps for producing a SOI substrate.
Figure 8B:
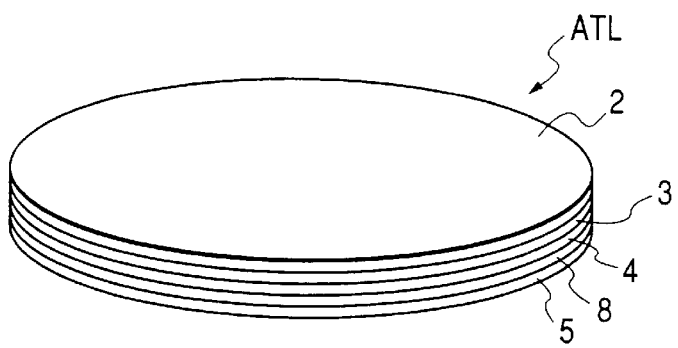
Figure 8C:
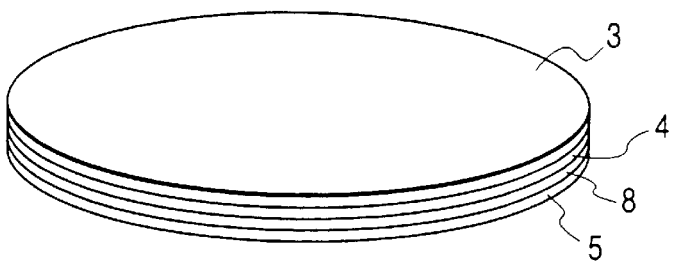
Figure 8D:
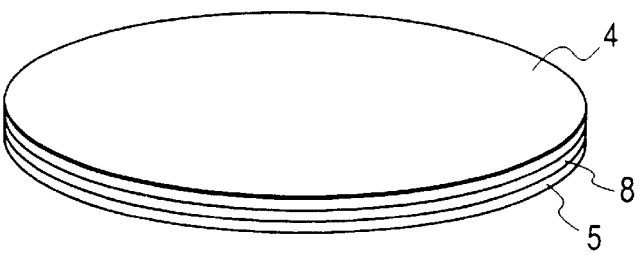

In another process of preparing the SOI substrate of this Embodiment, a Si wafer is used as the supporting substrate, and a insulating layer of an SOI structure is formed by forming a Si oxide layer on the epitaxial Si layer on the device substrate side without forming the Si oxide layer on the Si wafer side. FIGS. 8A to 8D shows this process. The upper device substrate in FIG. 8A is prepared in the same manner as described by reference to FIG. 5. The surface of monocrystalline Si layer 5 of a Si wafer is counterposed with the surface of Si oxide layer 8, and bonded thereto. The bonding can be strengthened by anode bonding, pressing, or heating, or a combination thereof. Thus article ATL is obtained as shown in FIG. 8B. Article ATL is separated at the porous Si layer to transfer epitaxial Si layer 4 of nonporous monocrystalline Si onto nonporous Si layer 5 as supporting substrate HW by means of the apparatus shown in FIG. 1. If porous Si layer 3 remains on epitaxial Si layer 4 of supporting substrate HW as shown in FIG. 8C, it is selectively removed by the aforementioned method. Thus a SOI substrate is obtained as shown in FIG. 8D.

Embodiment 2

A SOI substrate is produced in this Embodiment by utilizing an excimer laser beam for separating, at the porous Si layer, the Si wafer to be recycled and the substrate to be worked into a SOI substrate. The excimer laser beam is focused on one point and is allowed to scan with the substrate plate fixed.

Figure 9:
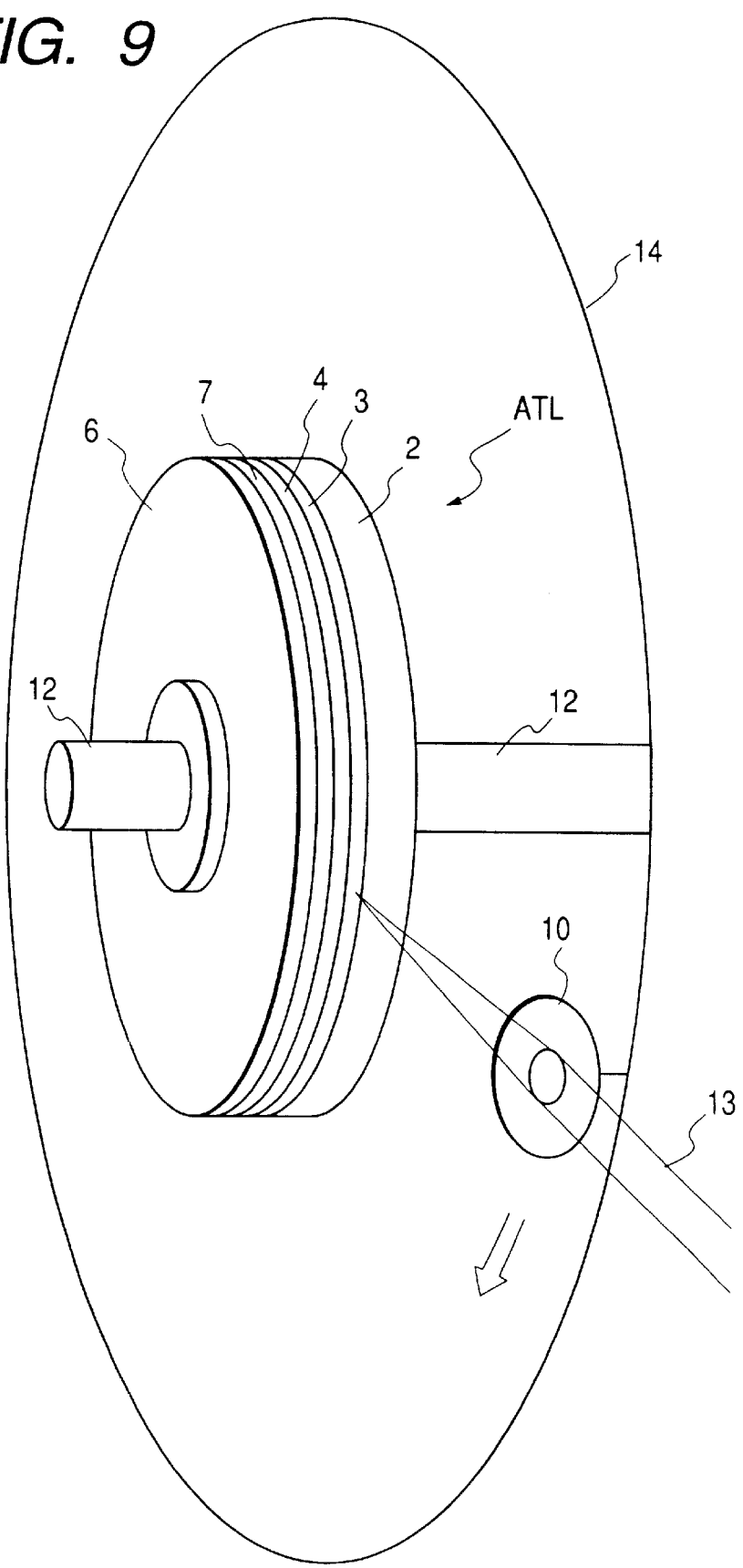
FIG. 9 illustrates a separation step in Embodiment 2 in which a laser beam is projected to a porous Si layer.

FIG. 9 illustrates the separation step. The laser beam is focused on the side face of article ATL with lens 10, and is allowed to scan along the circumference by aid of guide 14. The same reference numbers are used to indicate the same articles as in FIG. 1. In this Embodiment, monocrystalline Si layer 6 as nonporous layer and nonporous Si layer 2 constituting article ATL are fixed from the outside by chucks 12. The laser beam 13 from an excimer laser apparatus is focused and projected onto one point on the side wall of porous Si layer 3 through lens 10. Lens 10 is allowed to move together with laser beam 13 for the scanning to separate the SOI substrate composed of layers 4, 7, 6 from substrate 2 at porous Si layer 3 to recycle substrate 2 to the production steps. The less porous layer 4 on the layers 6, 7 is obtained. The other steps and the materials are the same as in Embodiment 1.

Embodiment 3

A SOI substrate is produced in this Embodiment by utilizing an excimer laser for separating the Si wafer to be recycled and the SOI substrate at the porous Si layer. The excimer laser beam is focused linearly by a cylindrical lens and is projected along the side face of the porous Si layer.

Figure 10:
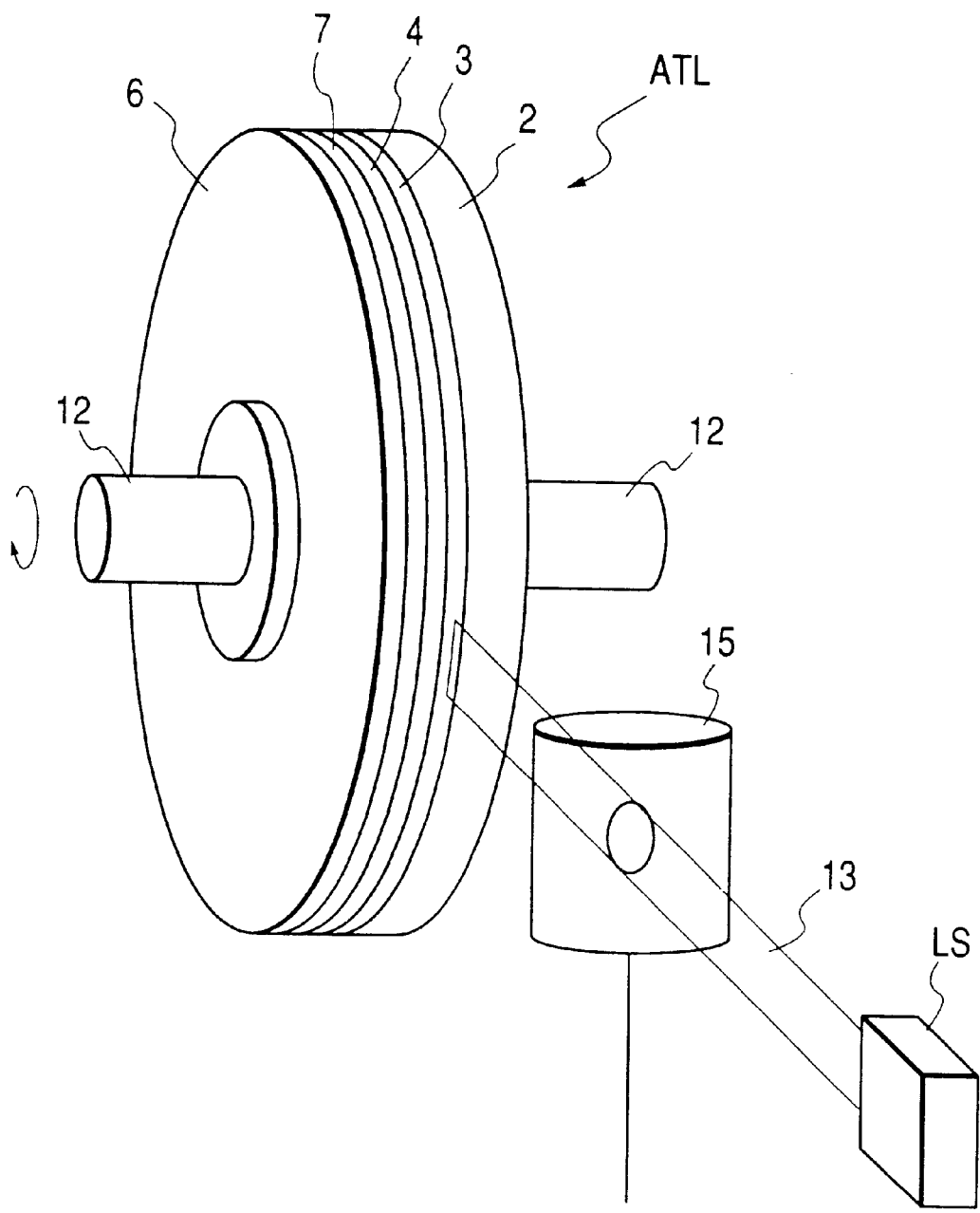
FIG. 10 illustrates a separation step in Embodiment 3 in which a laser beam is projected to a porous Si layer.

FIG. 10 illustrates the separation step. The numeral 15 indicates a cylindrical lens. The same reference numbers are used to indicate the same articles as in FIG. 1. The laser beam is focused linearly in a vertical direction for efficient projection onto the side face of porous Si layer 3 of an extremely small thickness of 0.1 to 30 μm. In place of cylindrical lens 15, a toric lens may be used to project linearly focused laser beam to the curved side wall of porous Si layer 3. The other steps are the same as in Embodiment 1.

Embodiment 4

Figure 11:
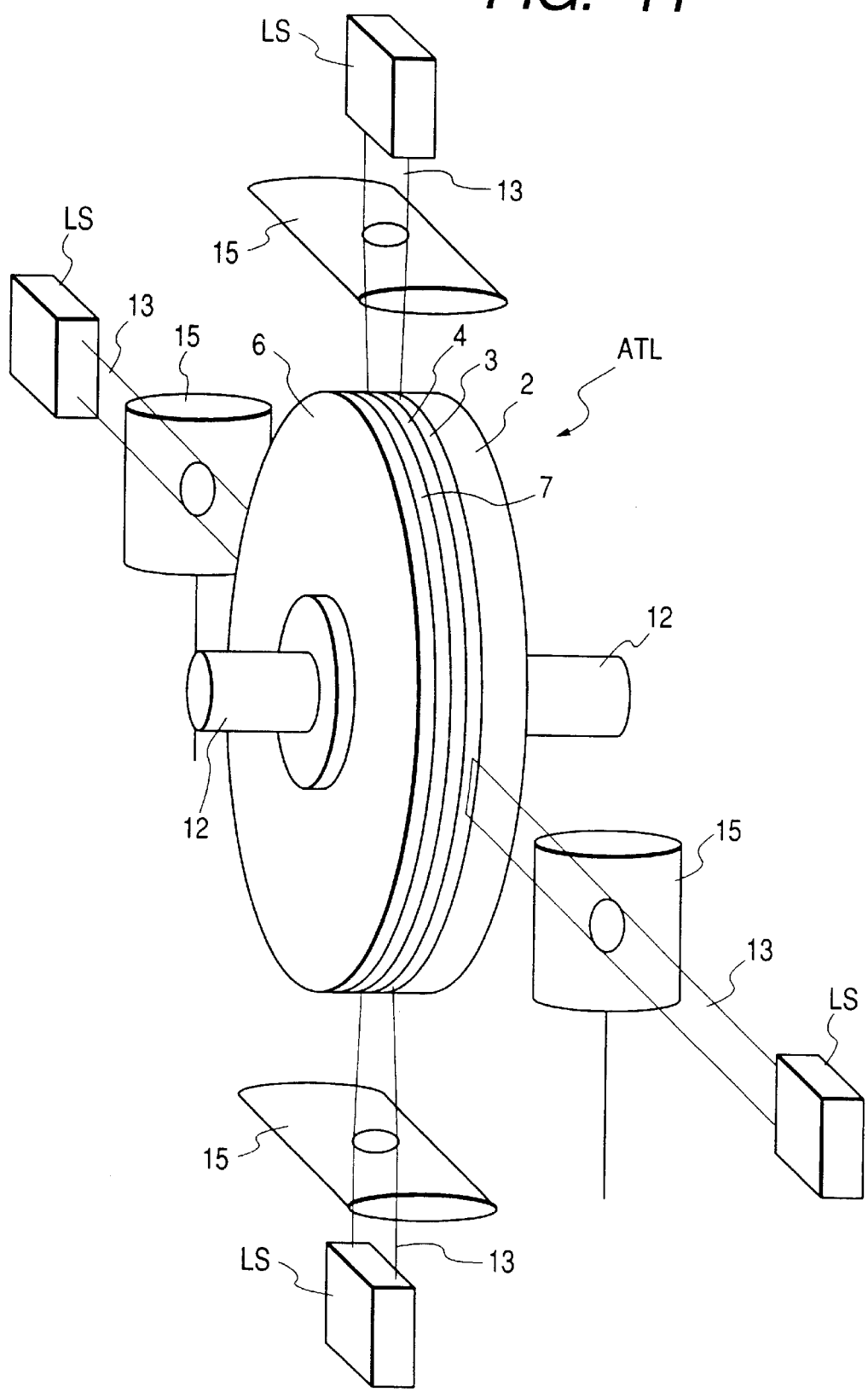
FIG. 11 illustrates a separation step in Embodiment 4 in which a laser beam is projected to a porous Si layer.

A SOI substrate is produced in this Embodiment by utilizing an excimer laser for separating, at the porous Si layer, the Si wafer to be recycled and the SOI substrate. The excimer laser beams are focused linearly by cylindrical lenses and are projected along the end face of the porous Si layer. In the laser beam projection, as shown in FIG. 11, the laser light is separated into four beams, and laser beams 13 are respectively focused linearly and projected with four cylindrical lenses 15 from four directions along the end face of porous Si layer 3. In this Embodiment, monocrystalline Si layer 6 and nonporous Si layer 2 are fixed from the outside by chucks 12. The other steps are the same as in Embodiment 1.

Embodiment 5

Figure 12A:
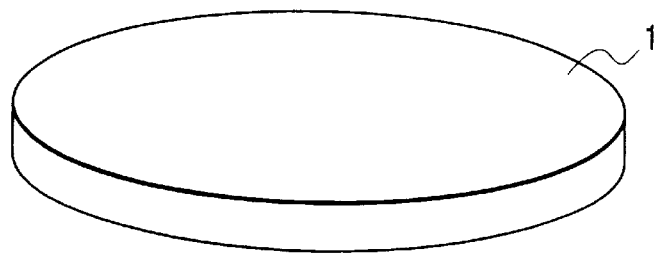
FIGS. 12A, 12B and 12C illustrate processes for producing a monocrystalline Si solar cell.
Figure 12B:
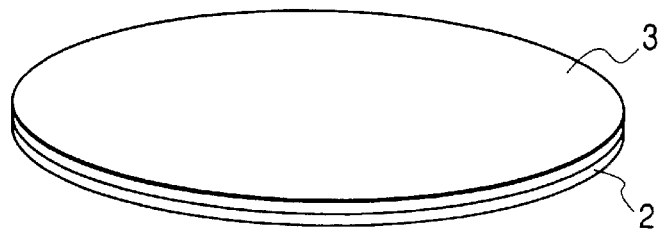
Figure 12C:
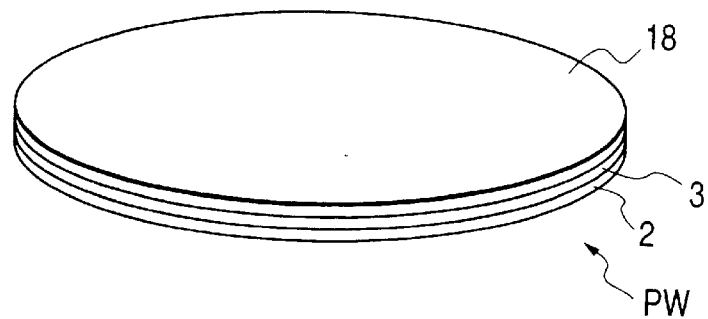

A solar cell is produced in this Embodiment. FIGS. 12A to 12C illustrate the steps of forming a photoelectric transducing layer for transducing light energy to electric energy. A p-type Si wafer 1 is provided as shown in FIG. 12A. The surface of Si wafer 1 is made porous by anodization as explained before by reference to FIG. 3 to prepare a substrate constituted of nonporous Si layer 2 of wafer 1 and porous Si layer 3 formed thereon as shown in FIG. 12B. On porous Si layer 3, an epitaxial Si layer to serve as photoelectric transducer 18 is formed as shown in FIG. 12C by molecular beam epitaxial growth, plasma CVD, low pressure CVD, photo-assisted CVD, bias sputtering, liquid crystal growth method, or a like method to prepare a substrate PW.

The epitaxial Si layer is allowed to grow with addition of a dopant for use as a photoelectric transducing layer. Thereby, the epitaxial layer has PN junction caused by lamination of an $n^+$ layer, a $p^-$ layer, and a $p^+$ layer formed in this order on porous Si layer 3. The surface of the $p^+$ layer of photoelectric transducing layer 18 grown epitaxially is bonded and connected to backside metal electrode 16 formed preliminarily on the surface of plastic substrate 17. Then vacuum chuck 12 is brought into close contact with the outside of nonporous Si layer 2. A laser beam 13 from an excimer laser apparatus is focused and projected through lens 10 onto porous Si layer 3. Although the laser light is focused onto one point in FIG. 13, the laser beam may be projected in any way as described in Embodiments 1 to 4. In such a manner, substrate HW to be used as a solar cell is separated at porous Si layer 3 from substrate PW to be recycled to production process as shown in FIG. 14.

Figure 15A:
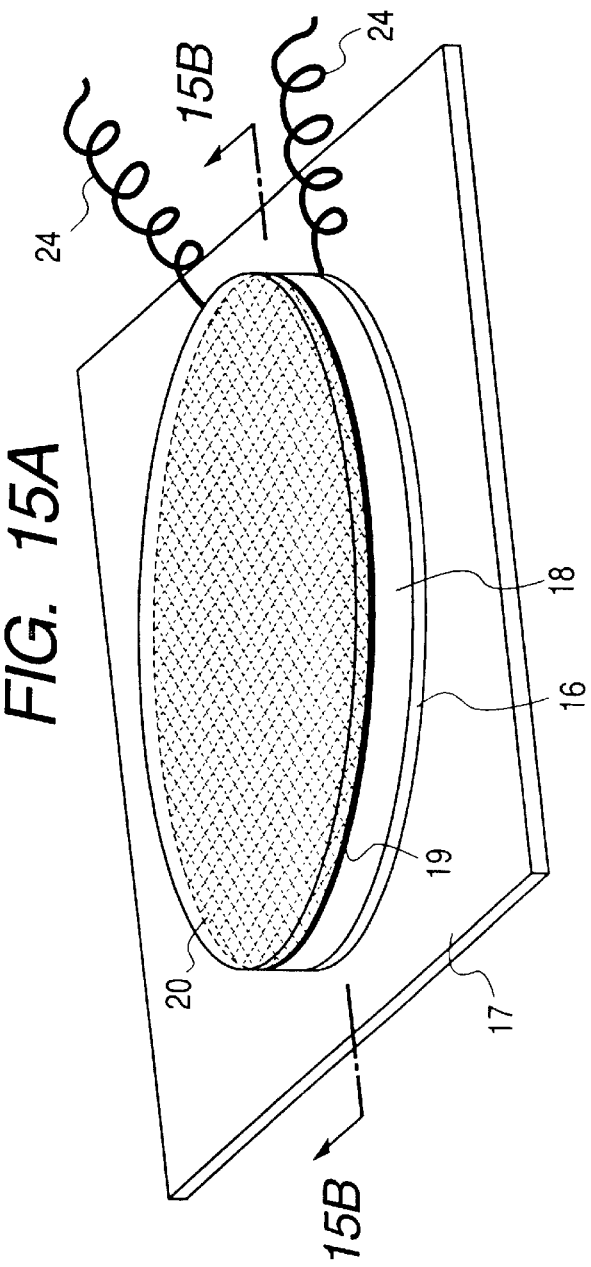
FIG. 15A is a perspective view of a monocrystalline Si solar cell.
Figure 15B:
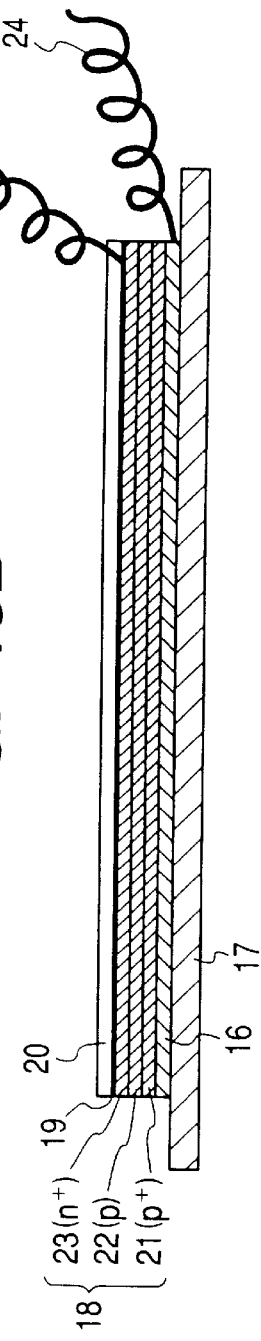
FIG. 15B is a sectional view thereof.
Figure 16A:
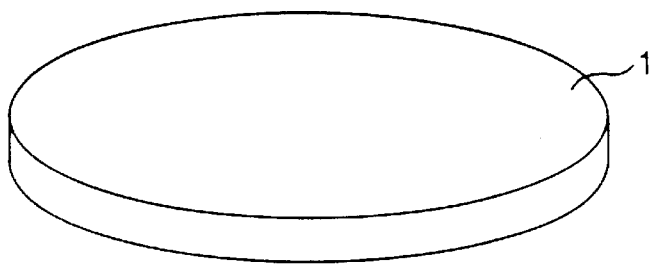
FIGS. 16A, 16B, 16C, 16D and 16E illustrate steps of producing a SOI substrate.
Figure 16B:
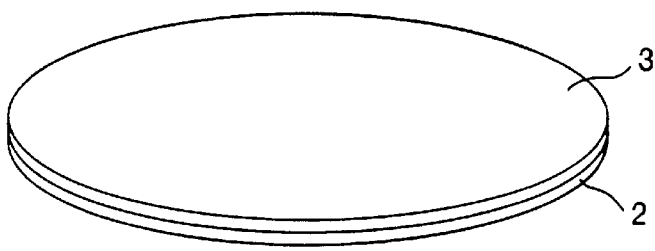
Figure 16C:
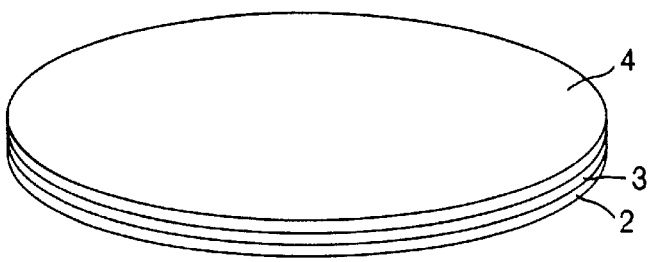
Figure 16D:
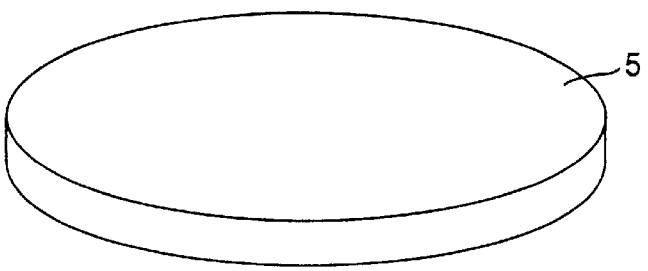
Figure 16E:
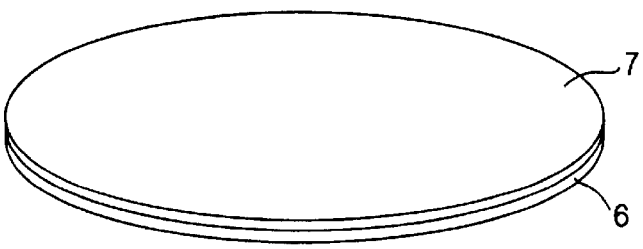
Figure 17A:
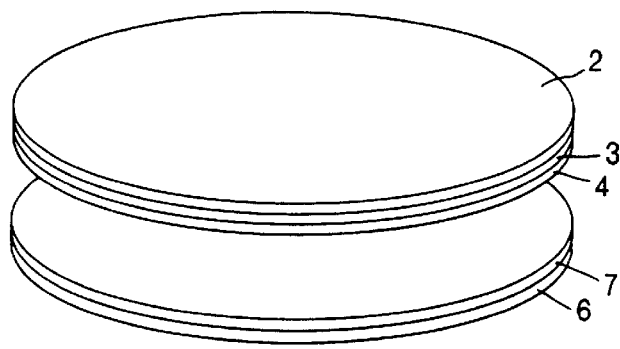
FIGS. 17A, 17B, 17C and 17D illustrate steps of producing a SOI substrate.
Figure 17B:
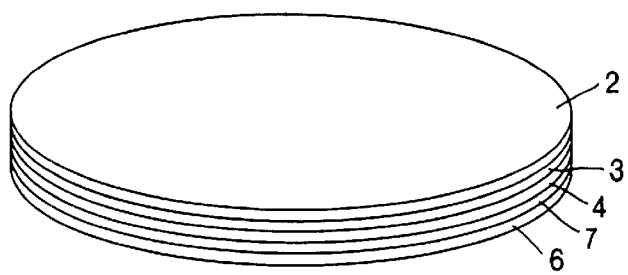
Figure 17C:
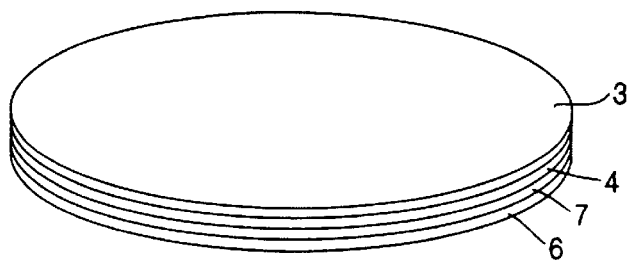
Figure 17D:
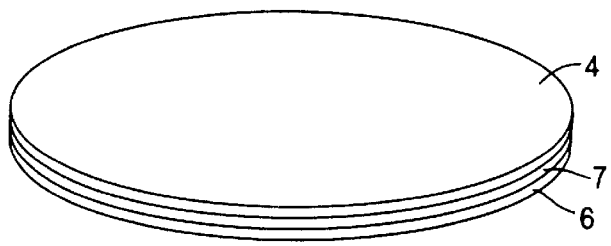
Figure 18:
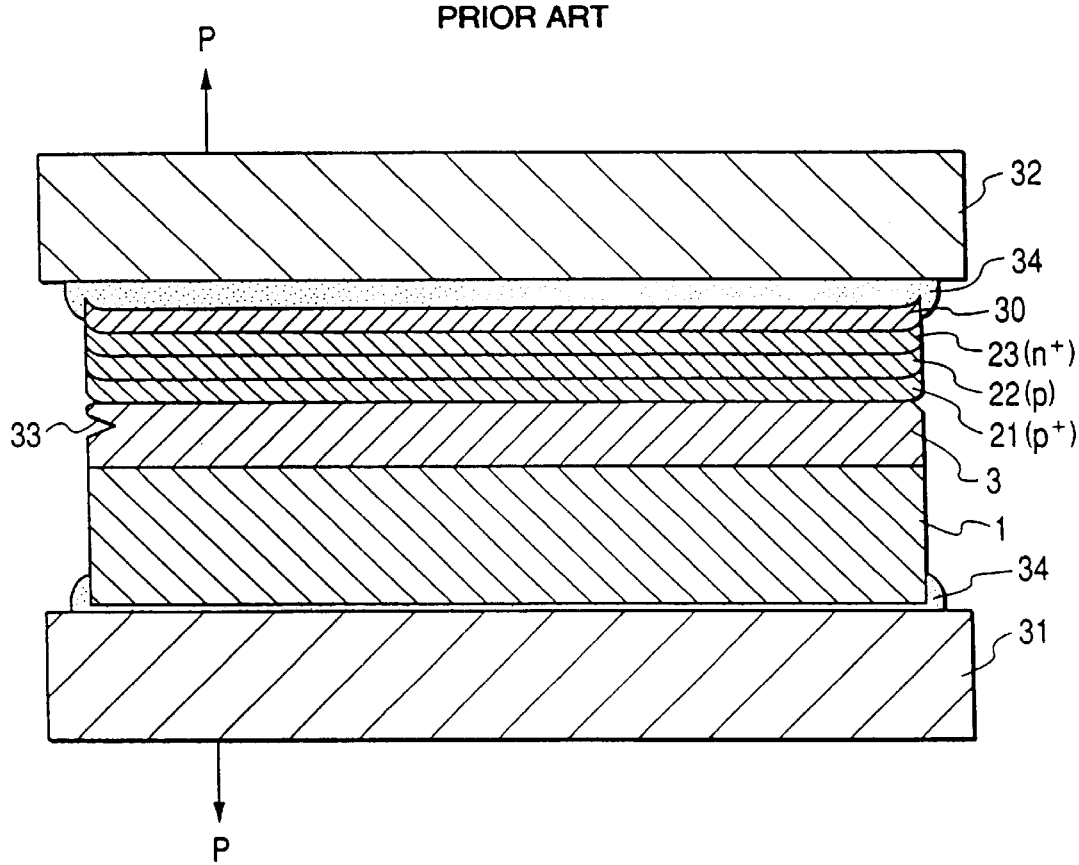
FIG. 18 illustrates a conventional process for producing a solar cell.

A meshed surface metal electrode 19 is formed on the surface of photoelectric transducing layer 18 as shown in FIG. 15A. Wiring 24 is connected to surface metal electrode 19 and backside metal electrode 16. Protection layer 20 is formed on the surface metal electrode 19. FIG. 15B is a sectional view taken at 15B—15B in FIG. 15A. Photoelectric transducing layer 18 is constituted of the layers of $n^+$ layer 23 in contact with surface metal electrode 19, p layer 22, and $p^+$ layer 21 in contact with backside metal electrode 16, arranged in this order from the upper side. In FIGS. 15A and 15B, surface metal electrode 19 is shown in a shape of a mesh to transmit light. However, it may be replaced by a transparent electrode made of a material like ITO. Backside metal electrode 16 serves also as a back reflector for returning unabsorbed transmitted light to photoelectric transducing layer 18, so that it is preferably made of a metallic material having high reflectivity.

According to this Embodiment, many solar cells of a monocrystalline thin film can be produced from one Si wafer. Therefore, this Embodiment is advantageous in transducing efficiency, cell life, and production cost. Further, the substrate is separated by projecting a laser beam to the porous Si layer to cause thermal expansion and distortion of the crystal without application of a strong pulling force and without necessity of strong bonding between the substrate and the jig or the like. From this viewpoint also, the process of this Embodiment is advantageous in production cost.

Embodiment 6

A solar cell is produced in this Embodiment also. In the above Embodiment 5, photoelectric transducer 18 is constituted of an epitaxial Si layer formed on porous Si layer 3, whereas in this Embodiment, porous Si layer of a small porosity per se is utilized, as it is, as photoelectric transducing layer 18. In Embodiment 1, it is described that the porosity of the porous Si layer can be varied by changing the current density in anodization. Specifically, in anodization explained by reference to FIG. 3, the higher density of the electric current flowing from electrode 28 to electrode 29 increases the porosity of porous Si layer formed on Si wafer 1, while the lower density of the current decreases the porosity. By this phenomenon, the surface of $p^+$ type Si wafer 1 is made porous by forming a porous Si layer of a smaller porosity by controlling the current density lower, and porous Si layer 3b of larger porosity is formed under it on nonporous layer 2. To the outermost layer of porous Si layer 3a, donor ions such as P and As are implanted to make the outermost layer on n-type, thereby forming a photoelectric transducing layer having a porous Si layer of small porosity having a PN junction.

Figure 13:
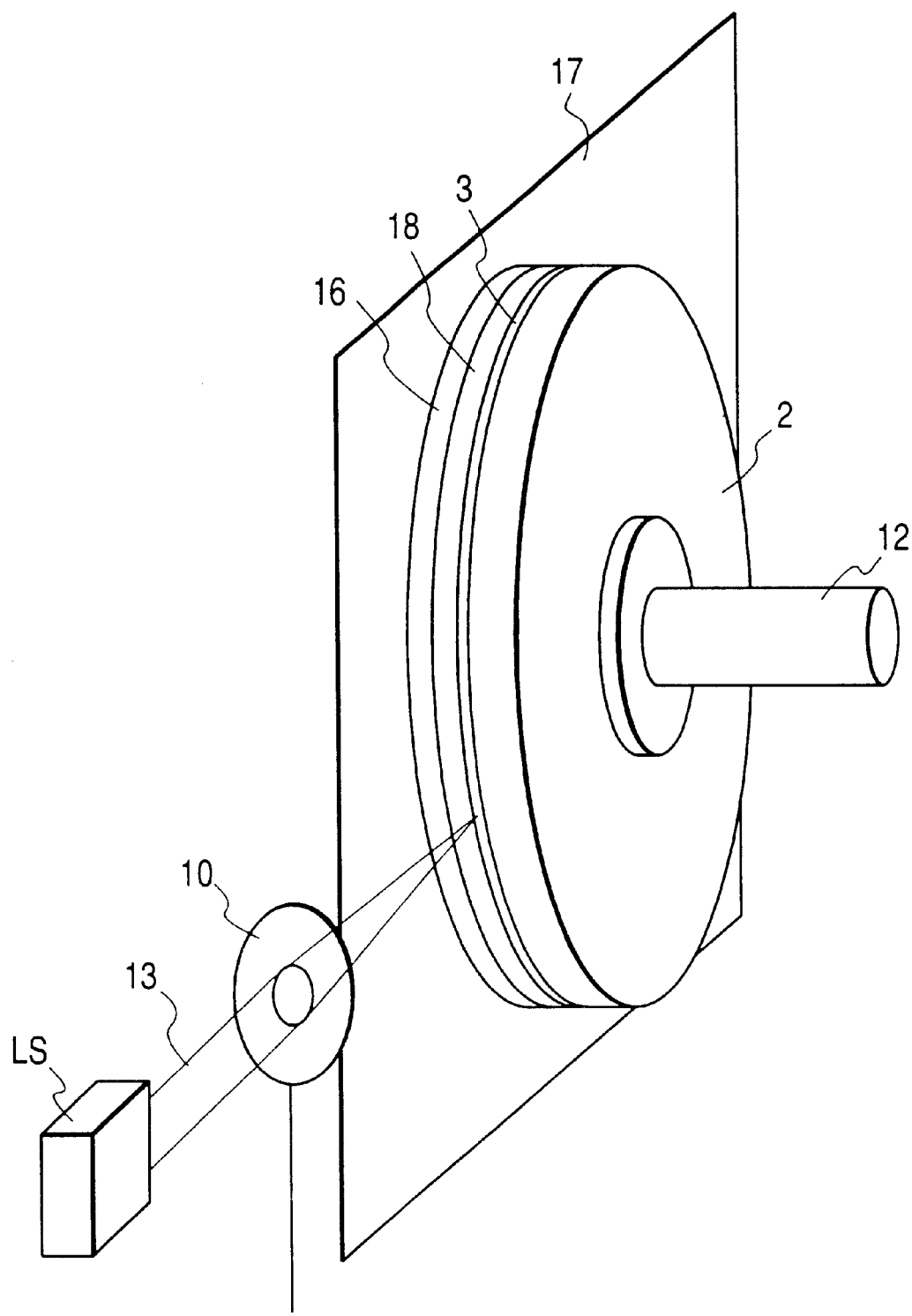
FIG. 13 illustrates a separation step in Embodiment 5 in which a laser beam is projected to a porous Si layer.
Figure 14:
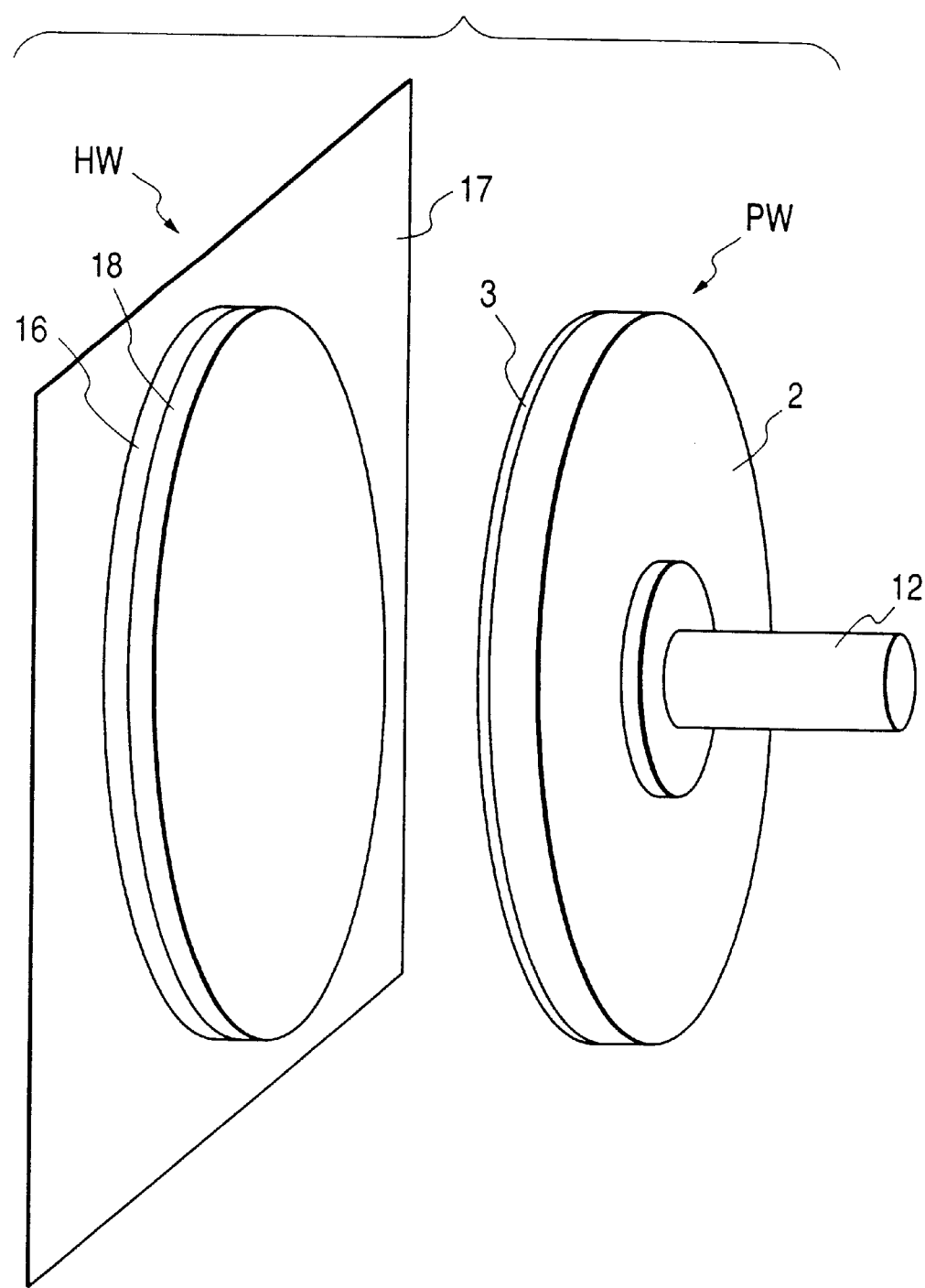
FIG. 14 illustrates substrates after the separation.

Thereafter, the porous Si layer of a smaller porosity as the photoelectric transducer is bonded to backside metal electrode 16 as shown in FIG. 13. The other steps are conducted in the same manner as in Embodiment 5.

According to this Embodiment, many solar cells of a monocrystalline thin film can be produced from one Si wafer. Therefore, this Embodiment is advantageous in transducing efficiency, cell life, and production cost. Further, epitaxial growth is not conducted in the process of this Embodiment, and the production cost is lower than that of Embodiment 5. The photoelectric transducing layer 18 is composed of a porous Si layer of smaller porosity with the monocrystallinity maintained, and light is scattered appropriately by the pores to result in high transducing efficiency.

Embodiment 7

An area sensor is produced. In this Embodiment, a photoelectric transducing layer of monocrystalline thin film is formed from an Si wafer in the same manner as in Embodiment 5 or 6. On this photoelectric transducing layer, optical sensors are arranged two-dimensionally, and matrix wiring is provided. The matrix wiring is formed, for example, by providing a row wiring in place of surface metal electrode 19 in FIGS. 15A and 15B and providing a line wiring in place of backside metal electrode 16 in FIGS. 15A and 15B. This Embodiment is advantageous in transducing efficiency, cell life, production cost, area enlargement, and so forth, since many area sensors of a monocrystalline thin film can be produced from one Si wafer.

Embodiment 8

An Si wafer is prepared as one substrate. Over the entire face of the Si wafer, hydrogen ions or rare gas ions are implanted in a prescribed depth by means of an ion implanter to form a defective layer of microbubbles in the interior of the Si wafer.

Separately, another Si wafer is prepared as the supporting substrate. This supporting substrate is oxidized at the surface, and is bonded to the surface of the above Si wafer having a microbubble-defective layer.

To the bonded wafer article, an excimer laser beam is projected around the microbubble-defective layer of the side face of the article in a manner shown in FIG. 1, 9, 11, or 13. Thereby, the defective layer is made more fragile by absorption of the excimer laser beam. Then the two wafers are separated.

In such a manner, the monocrystalline Si layer on the defective layer of the one substrate Si layer is transferred onto the silicon oxide film on the other substrate. The microbubble formation by ion implantation is described in detail in U.S. Pat. No. 5,374,564.

The above description is made regarding the case of Si wafers, but the present invention can be applied to other semiconductors other than Si, such as SiGe, Ge, SiC, GaAs, and InP.

According to the present invention, many monocrystalline thin Si films can readily be produced by projecting a laser beam from the side face of a substrate into the center portion of the porous layer to cause absorption of the laser beam by the porous layer. Since the laser beam does not cause impurity contamination, the resulting thin Si film has high quality, and the resulting SOI substrate also has high quality. In production of SOI substrates, the material is used with less waste, resulting in low production cost and resource saving. The resulting photoelectric transducing apparatus also has high quality. Also in producing photoelectric transducing apparatus, the material is used with less waste, resulting in low production cost and resource saving.

What is claimed is:

1. A process for forming a thin film comprising the steps of:

injecting hydrogen ions or ions of rare gas into a substrate to form an ion-implanted layer in the substrate;

bonding on a surface of the substrate another substrate; and separating a layer above the ion-implanted layer from a layer below the ion-implanted layer, wherein the separating step comprises a step of projecting a laser beam through a side face of the substrate parallel to the front and rear faces of the substrate into the center of the ion-implanted layer.

2. A process for fabricating a semiconductor film comprising the steps of:

bonding a first substrate having an ion-implanted layer and a second substrate to form a complex member, and separating the complex member at the ion-implanted layer, wherein the separating step is comprised of a step of irradiating a side face of the complex member with a laser beam, the laser beam directed through a side face of the complex member parallel to the front and rear faces of the complex member into the center of the complex member.

3. The process for fabricating a semiconductor film according to claim 2, wherein said separating step is comprised of irradiating a side face of said first substrate with said laser beam.

4. The process for fabricating a semiconductor film according to claim 3, wherein said separating step is comprised of irradiating said side face of said first substrate with said laser beam and is carried out so as to enable said laser beam to reach a vicinity of a center of said complex member.

5. The process for fabricating a semiconductor film according to claim 4, wherein said ion-implanted layer is formed by injecting hydrogen ions or rare gas ions into a silicon substrate.

6. The process for fabricating a semiconductor film according to claim 5, wherein said ion-implanted layer is formed by forming a silicon oxide layer on a surface of said silicon substrate and injecting said hydrogen ions or said rare gas ions into said silicon substrate from the silicon oxide layer side.

7. The process for fabricating a semiconductor film according to claim 3, wherein said ion-implanted layer is formed by injecting hydrogen ions or rare gas ions into a silicon substrate.

8. The process for fabricating a semiconductor film according to claim 7, wherein said ion-implanted layer is formed by forming a silicon oxide layer on a surface of said silicon substrate and injecting said hydrogen ions or said rare gas ions into said silicon substrate from the silicon oxide layer side.

9. The process for fabricating a semiconductor film according to claim 2, wherein said ion-implanted layer is formed by injecting hydrogen ions or rare gas ions into a silicon substrate.

10. The process for fabricating a semiconductor film according to claim 9, wherein said ion-implanted layer is formed by forming a silicon oxide layer on a surface of said silicon substrate and injecting said hydrogen ions or said rare gas ions into said silicon substrate from the silicon oxide layer side.

11. The process for fabricating a semiconductor film according to claim 2, wherein said separating step is carried out by focusing said laser beam onto a side face of said ion-implanted layer.

12. The process for fabricating a semiconductor film according to claim 2, wherein said laser beam is an excimer laser.

13. The process for fabricating a semiconductor film according to claim 2, wherein said separating step is carried out while rotating said complex member.

* * * * *